(12) United States Patent
Classen et al.

(10) Patent No.: US 11,667,520 B2
(45) Date of Patent: Jun. 6, 2023

(54) MANUFACTURING METHOD FOR A MICROMECHANICAL COMPONENT, A CORRESPONDING MICROMECHANICAL COMPONENT AND A CORRESPONDING CONFIGURATION

(71) Applicant: Robert Bosch GmbH, Stuttgart (DE)

(72) Inventors: Johannes Classen, Reutlingen (DE); Frank Reuss, Reutlingen (DE); Manuel Dietrich, Reutlingen (DE); Timm Hoehr, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 134 days.

(21) Appl. No.: 17/393,694

(22) Filed: Aug. 4, 2021

(65) Prior Publication Data
US 2022/0041432 A1    Feb. 10, 2022

(30) Foreign Application Priority Data

Aug. 6, 2020   (DE) .......................... 102020209934.0

(51) Int. Cl.
*H01L 21/50*   (2006.01)
*B81B 7/00*    (2006.01)
*B81C 1/00*    (2006.01)

(52) U.S. Cl.
CPC ............ *B81B 7/008* (2013.01); *B81C 1/0023* (2013.01); *B81C 2203/031* (2013.01)

(58) Field of Classification Search
None
See application file for complete search history.

(56) References Cited

U.S. PATENT DOCUMENTS 7,250,353 B2    7/2007   Nasiri et al.
7,442,570 B2   10/2008   Nasiri et al.
(Continued)

FOREIGN PATENT DOCUMENTS

CN    109641741 A  *  4/2019   .......... B81B 3/0005
DE    102007048604 A1    4/2009
(Continued)

OTHER PUBLICATIONS

MC3672 3 Axis Accelerometer Data Sheet. mCube 2019. Retrieved from the Internet on Aug. 3, 2021: https://mcubemems.com/product/mc3672-3-axis-accelerometer/. 84 Pages.

*Primary Examiner* — Michael Lebentritt
(74) *Attorney, Agent, or Firm* — Norton Rose Fulbright US LLP; Gerard Messina

(57) ABSTRACT

A manufacturing method for a micromechanical component. The method includes: providing an ASIC component including first front and rear sides, a strip conductor unit being provided at the first front side; providing a MEMS component including second front and rear sides, a micromechanical functional element situated in a cavity at the second front side; bonding the first front side onto the second front side; back-thinning the first rear side; forming vias starting from the back-thinned first rear side and from a redistribution unit on the first rear side, the vias electrically connecting the strip conductor unit to the redistribution unit; forming electrical contact elements on the redistribution unit; and back-thinning the second rear side. The back-thinning of the first and second rear side taking place so that a thickness of the stack made up of ASIC component and MEMS component is less than 300 micrometers.

15 Claims, 13 Drawing Sheets

(56) References Cited

U.S. PATENT DOCUMENTS

| | | |
|---|---|---|
| 9,831,195 B1 * | 11/2017 | Lu .......................... H01L 23/13 |
| 2006/0208326 A1 | 9/2006 | Nasiri et al. |
| 2010/0109102 A1 | 5/2010 | Chen et al. |
| 2011/0012247 A1 | 1/2011 | Wu |
| 2011/0049652 A1 | 3/2011 | Wu et al. |
| 2012/0049299 A1 | 3/2012 | Chou |
| 2015/0077658 A1 | 3/2015 | Pugh et al. |
| 2016/0097940 A1 | 4/2016 | Sako et al. |
| 2016/0347609 A1 | 12/2016 | Yu et al. |
| 2019/0006305 A1 * | 1/2019 | Huang .................. H01L 21/486 |
| 2021/0305226 A1 * | 9/2021 | Tsai .................... H01L 25/0657 |

FOREIGN PATENT DOCUMENTS

| | | | |
|---|---|---|---|
| DE | 102009000167 A1 | 7/2010 | |
| DE | 102009045391 A1 | 4/2011 | |
| DE | 102011080978 A1 | 2/2013 | |
| DE | 102013222616 A1 | 5/2015 | |
| DE | 102014200507 A1 | 7/2015 | |
| DE | 102015216471 A1 | 3/2017 | |
| DE | 102017207887 B3 * | 10/2018 | ........... B32B 15/043 |
| DE | 102019219476 A1 * | 6/2021 | |

* cited by examiner

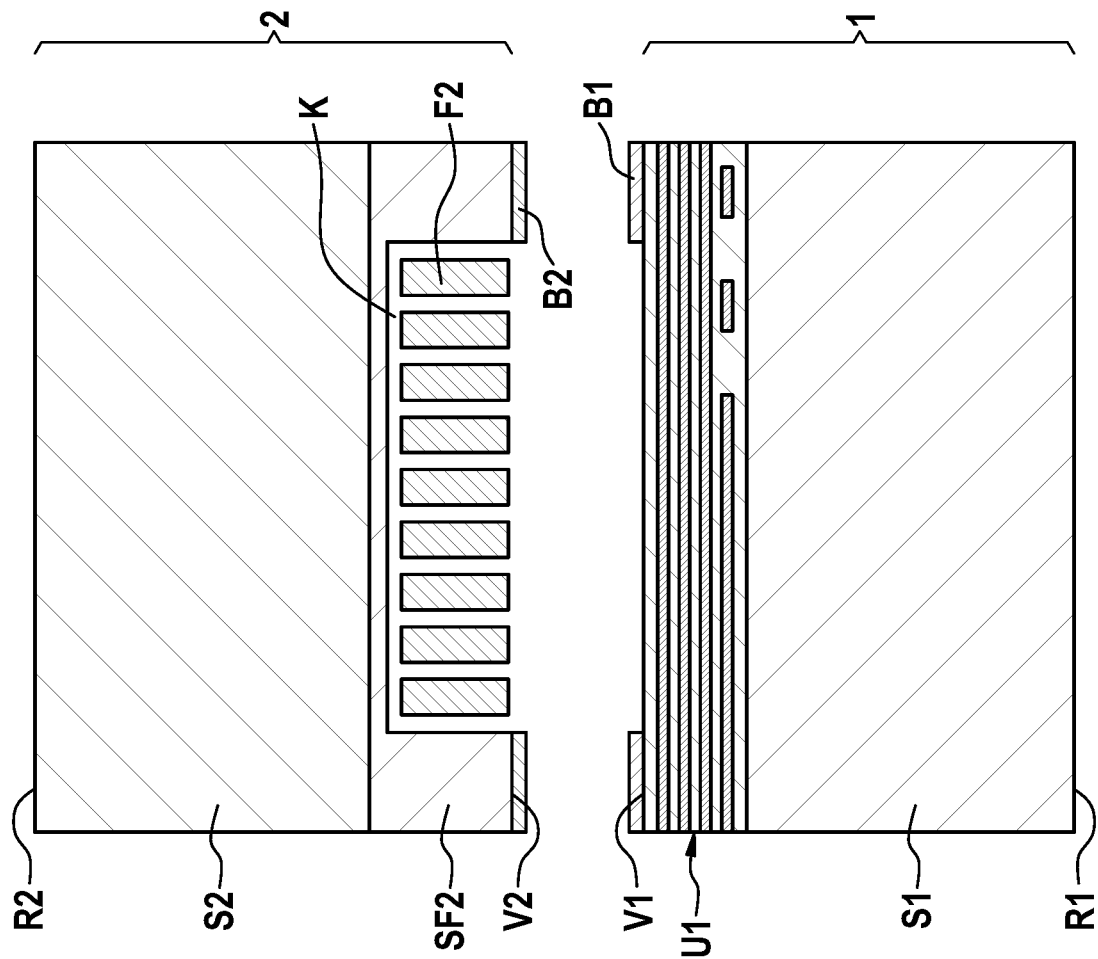

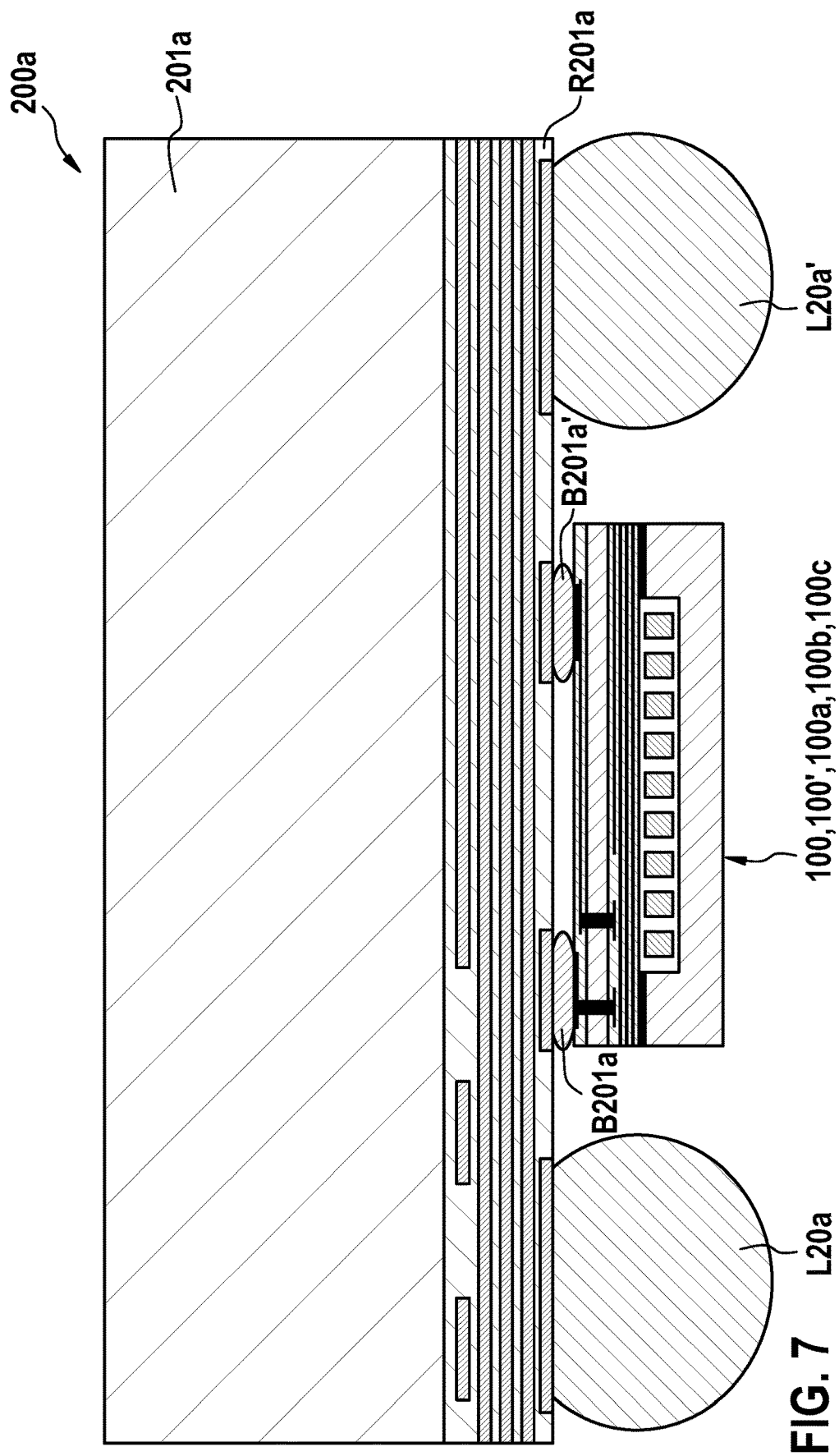

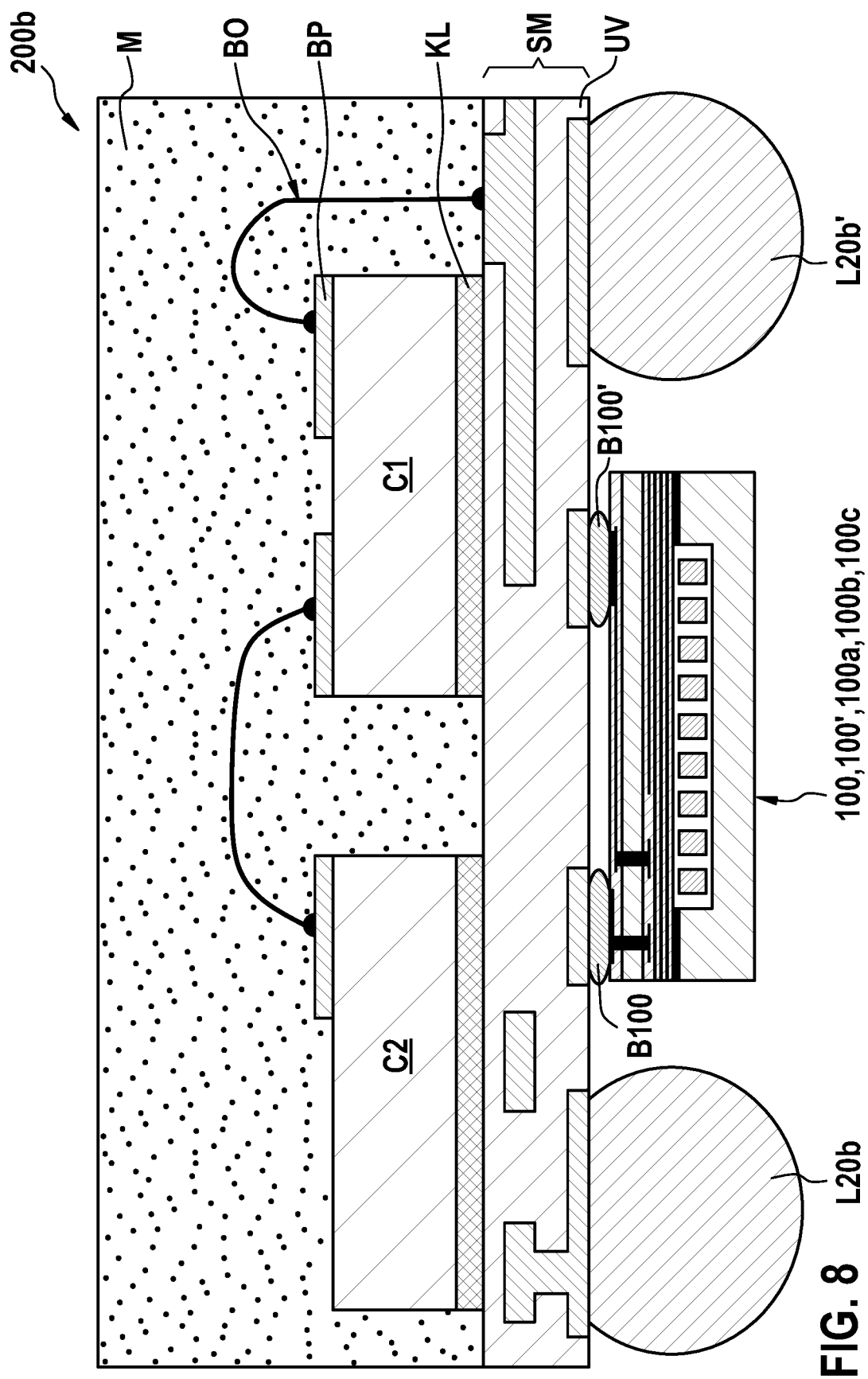

MANUFACTURING METHOD FOR A MICROMECHANICAL COMPONENT, A CORRESPONDING MICROMECHANICAL COMPONENT AND A CORRESPONDING CONFIGURATION

FIELD

The present invention relates to a manufacturing method for a micromechanical component, to a corresponding micromechanical component and to a corresponding configuration.

BACKGROUND INFORMATION

Micromechanical sensors for measuring acceleration, rotation rate and magnetic field are conventional and are mass produced for various applications in the automobile and consumer sector. One general trend in consumer electronics is the miniaturization of the components. This serves on the one hand to reduce costs (as a result of smaller chip surfaces), but a small footprint of the components is also a great customer benefit, since the space on the application circuit boards, for example, in mobile telephones, but in particular in "wearables" and "hearables" is severely limited. Moreover, there will probably be new applications for MEMS sensors in the coming years, for example, in smart contact lenses, which require an extreme size reduction both with regard to the lateral (footprint) as well as the vertical dimensions (overall height); see in this regard, for example, U.S. Patent Application Publication No. U.S. 2016 0 097 940 A1. A reduction in overall height would probably be of great advantage for smart clothes as well.

In the related art, multiple chips for the various measured variables are usually installed in a plastic housing (for example, LGA, BGA, QFN) as a so-called system-in-package (SiP). The aforementioned systems include different separated chips, which are functionally connected with the aid of a wire bond connection or via solder balls. Alternatively, MEMS chips and ASIC chips may already be vertically integrated at the wafer level. Vertical integration in this case refers to the joining of MEMS and ASIC wafers in combination, electrical contacts between the MEMS functional elements and the ASIC being established. Examples of vertical integration methods are described in U.S. Pat. Nos. U.S. Pat. No. 7,250,353 B2 and U.S. Pat. No. 7,442,570 B2, U.S. Patent Application Publication Nos. U.S. 2010 0 109 102 A1, U.S. 2011 0 049 652 A1, U.S. 2011 0 012 247 A1 and U.S. 2012 0 049 299 A1 and German Patent Application No. DE 10 2007 048 604 A1.

The most effective way to miniaturize the MEMS components is to use chip scale packages (CSP), in which any substrates, adhesives, bonding wires, mold compounds, etc. are omitted and "naked" silicon chips ("bare die") are mounted directly onto the application circuit board.

German Patent Application No. DE 10 2013 222 616 A1 describes a micromechanical sensor device, including a first unhoused sensor unit and at least one second unhoused sensor unit. The sensor units are functionally connected to one another, the sensor units being situated essentially vertically one above the other so that a sensor unit having a larger footprint completely covers a sensor unit having a smaller footprint.

Vertically integrated CSP components are already available on the market, for example, in the form of a three-axis acceleration sensor MC3672 of mCube.

(http://mcubemems.com/product/mc3672-3-axis-accelerometer/). At less than 1.5 mm$^2$, the footprint of this sensor is extremely small, however the overall height at 0.74 mm is within the range of the industry standard of 0.6 mm to 1.0 mm for sensors in the CE (consumer electronics) market. The manufacture of significantly thinner sensors becomes increasingly more challenging with decreasing overall height for multiple reasons.

Firstly, it is very difficult to handle very thin wafer stacks. Wafer thicknesses in the range of less than 300 µm, at most, however less than 200 µm are barely able to still be handled safely using normal manufacturing equipment. The risk of wafer fracture increases drastically. This is all the more the case if the wafer stack exhibits high intrinsic stresses, for example, due to a complex stack of functional layers made of various materials, as is usual in both a MEMS wafer as well as in an ASIC wafer. It is possible with temporary bonding/debonding methods to use so-called handle wafers to stabilize the wafer composite for particular, critical further processing steps, however, these methods are relatively cost-intensive and are also not available in every semiconductor factory.

Secondly, the wafer bow presents a problem. The above-mentioned complex layer stack in the MEMS-ASIC wafer stack furthermore results in increased values for the wafer bow (i.e., the deflection of the wafer during or after the processing). Very high mechanical stresses may form at the bond interface, in particular, during wafer bonding, i.e., during the joining of MEMS and ASIC wafers since, due to temperature inhomogeneities in the wafer bonder, not all areas on the wafer form the bonding connection at the same time. Even if a simultaneous bonding of all wafer areas took place, significant tensions and thus high bow values in the wafer composite could occur as a result of the different thermal expansion coefficients of the materials in the layer stack, since most bonding processes take place at sharply increased temperatures compared to room temperature. The wafer bow values in most cases become greater, the thinner the wafer stack is. Accordingly, the wafer bow increases successively during the back-thinning of the wafer stack. If, however, the bow values exceed particular maximum values (these are a function of the equipment, but are typically in the range of a few 100 µm), the wafers are no longer able to be processed since, for example, a vacuum suction on a wafer chuck is no longer possible.

Thirdly, performance losses occur. Strong back-thinning of the wafer stack results, among other things, in a massively increased flexural sensitivity of MEMS components. Of capacitive acceleration sensors, for example, it is known that mechanical stress, which is transferred from the application circuit board onto the MEMS substrate and from there to the movable MEMS structures and to the evaluation electrodes, may generate large error signals (in particular, offset errors, but also sensitivity errors). As a simplistic illustration, a wafer or wafer stack may be viewed as a flexible tongue. The flexural stiffness then increases with the thickness to the third power. Thus, when halving the wafer thickness, the flexural stiffness is reduced by a factor of 8. The error signals of the MEMS component may be correspondingly greater due to externally instilled mechanical stress, regardless of the cause of the mechanical stress (for example, circuit board deflection resulting from the assembly, thermomechanical stress due to temperature changes, stress relaxation as a result of ageing).

Negative influences of mechanical stress on the performance, for example, of acceleration sensors have long been known. To reduce these influences, optimized surface micromechanical processes (for example, described in German Patent Application No. DE 10 2011 080 978 A1) and sensor topologies (for example, described in DE 10 2009 045 391 A1 for x,y-acceleration sensors and described in DE 10 2009 000 167 A1 for z-acceleration sensors) have been developed, in which two micromechanical layers may be exposed and used for complex mass and electrode configurations. With these new technologies and designs, it is possible to massively reduce the influence of mechanical stress on the sensor performance (offset errors and sensitivity errors), which is also important for the present EM.

The typical overall thicknesses of the functional layers of MEMS wafers are on the order of 20 μm to 40 μm. They are made up of the thickness of sacrificial layers, in surface micromechanical processes, in particular, oxide layers, and frequently multiple electro-conductive layers, in particular, made of polycrystalline silicon, in which the functional structures such as, for example, seismic masses, springs, mountings, diaphragms, electrodes, feed lines, etc., are implemented. The overall thickness of the MEMS wafer, which is normally in the range of 200 μm to 700 μm, is thus determined less by the functional layers, but rather by the thickness of the MEMS substrate wafer.

It is similarly the case with ASIC or CMOS wafers. The total stack made up of doped silicon layers for manufacturing transistors and the metal oxide stack for wiring exhibits merely one cumulative thickness of typically 5 μm to 10 μm. The overall thickness of the CMOS wafer is determined essentially by the thickness of the wafer substrate, which is at least some ten micrometers, usually, however, even several hundred micrometers.

If a MEMS wafer is connected to a CMOS wafer via a metallic bonding method and if the electrical signals are guided with the aid of TSVs to the rear side (outer side) of the CMOS wafer (see FIG. 1), the bonding interface having a thickness of typically 1 μm to 3 μm and the passivation and redistribution layers on the CMOS rear side of typically 10 μm to 15 μm contribute further to the overall thickness.

In summary, therefore, layers of a total of approximately 40 μm to 60 μm in a vertically integrated MEMS-ASIC wafer stack including TSVs are directly functionally relevant, whereas the remainder of the wafer stack is determined by the substrate thickness of MEMS and ASIC to allow the aforementioned risks regarding handling, processability and performance to be manageable.

SUMMARY

The present invention provides a manufacturing method for a micromechanical component, a corresponding micromechanical component, and a corresponding system.

Preferred refinements of the present invention are disclosed herein.

An idea underlying an example embodiment of the present invention is to create an ultra-thin MEMS component integrated vertically with an ASIC component and a corresponding manufacturing method, the thickness of the total stack (ASIC thickness+MEMS thickness) capable of being less than 300 μm, preferably even less than 250 μm. In principle, even overall thicknesses of the wafer stack on the order of 100 μm may be achieved according to the present invention by extreme back-thinning, ultimately strongly limited only by the aforementioned cumulative thicknesses of the functional layers of 40 μm to 60 μm.

The manufacturing method according to the present invention and the corresponding micromechanical component have the advantage that reducing the overall height of a MEMS component makes it possible to be able to handle, in particular, overall height-critical applications. At the same time, the manufacturability on the one hand and the performance on the other hand of the MEMS component are reliably maintained by detailed aspects of the present invention. The footprint of the MEMS component may advantageously also be designable to be particularly small, since some applications are limited both in overall height as well as in footprint.

According to one preferred specific embodiment of the present invention, the bonding takes place via a metallic bonding process, prior to bonding a first bonding layer being applied to the first front side and a second bonding layer being applied to the second front side, which are connected to one another during bonding in a thermal process. This minimizes a deflection or stressing of the micromechanical component.

According to one further preferred specific embodiment of the present invention, one of the first and second bonding layers is made of aluminum and the other of the first and second bonding layers is made of germanium, and the thermal process being a thermally activated diffusion process at a temperature below 420° C. Such a material combination provides particularly good results.

According to one further preferred specific embodiment of the present invention, at least one further bonding area, which connects the ASIC component and the MEMS component to one another, is provided within the circumferential bonding frame. This enhances the flexural stiffness still further.

According to one further preferred specific embodiment of the present invention, the further bonding area is connected to a mechanical support web or to a mechanical support pillar of the MEMS component, which is decoupled from the micromechanical functional element. This decouples the micromechanical functional element from the mechanical stabilization area.

According to one further preferred specific embodiment of the present invention, the further bonding area is connected to a mechanical support web, which separates the cavity into one first sub-cavity and into one second sub-cavity, which are hermetically sealed from one another, one first micromechanical functional element being provided in the first sub-cavity and one second micromechanical functional element being provided in the second sub-cavity. Smaller stable sub-cavities may be produced in this way.

According to one further preferred specific embodiment of the present invention, the further bonding area is connected to a mechanical support pillar, which is guided through the micromechanical functional element. In this way, stabilizing elements may be manufactured at arbitrary locations of the cavity.

According to one further preferred specific embodiment of the present invention, the electrical contact elements are solder balls and/or solder pads.

According to one further preferred specific embodiment of the present invention, the micromechanical functional element is formed from a plurality of vertically stacked micromechanical functional layers. In this way, particularly stress-robust micromechanical functional elements may be manufactured.

BRIEF DESCRIPTION OF THE DRAWINGS

The present invention is explained in greater detail below with reference to the exemplary embodiments shown in the schematic figures.

FIGS. 1A1, 1A2 and FIGS. 1B through 1E schematically show cross sectional representations for explaining a micromechanical component and a corresponding manufacturing method according to one first specific embodiment of the present invention.

FIG. 2 schematically shows a cross sectional representation for explaining a micromechanical component according to one second specific embodiment of the present invention.

FIG. 7 schematically shows a cross sectional representation for explaining a configuration of micromechanical components according to one seventh specific embodiment of the present invention.

FIG. 8 schematically shows a cross sectional representation for explaining a configuration of micromechanical components according to one eighth specific embodiment of the present invention.

DETAILED DESCRIPTION OF EXAMPLE EMBODIMENTS

Figure 1B:
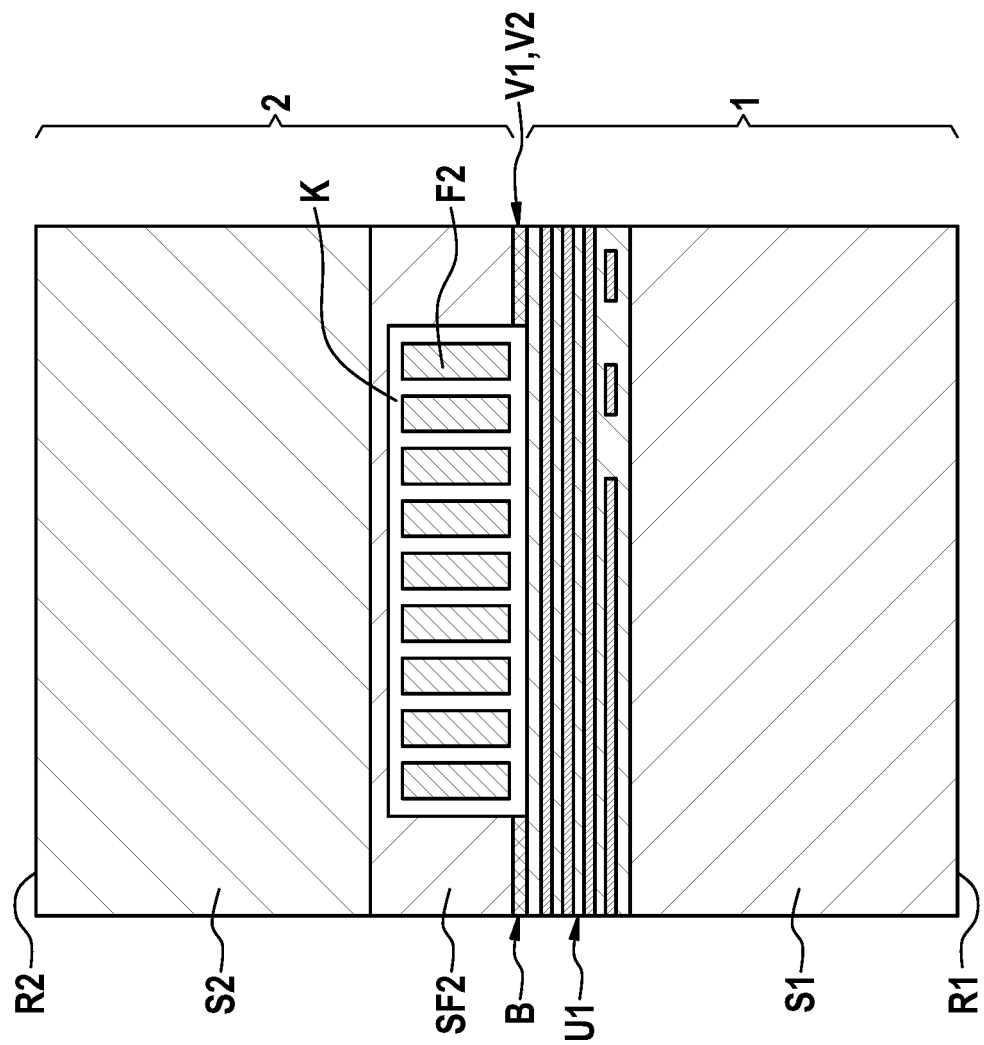

In the figures, identical reference numerals refer to identical or functionally identical elements.

FIGS. 1A1, 1A2 and FIGS. 1B through 1E schematically show cross sectional representations for explaining a micromechanical component and a corresponding manufacturing method according to one first specific embodiment of the present invention.

Reference numeral 1 in FIG. 1A1 identifies an ASIC component including a first front side V1 and a first rear side R1, a strip conductor unit U1 being provided at first front side V1. Strip conductor U1 is used for the electrical wiring of signals of ASIC circuit components (not shown), which are housed in corresponding ASIC substrate S1.

A first metallic bonding layer, which is used in subsequent steps for a bonding process, is applied in a ring-shaped manner on front side V1. For example, first metallic bonding layer B1 is manufactured from aluminum and has a ring-shaped closed shape.

Figure 2:
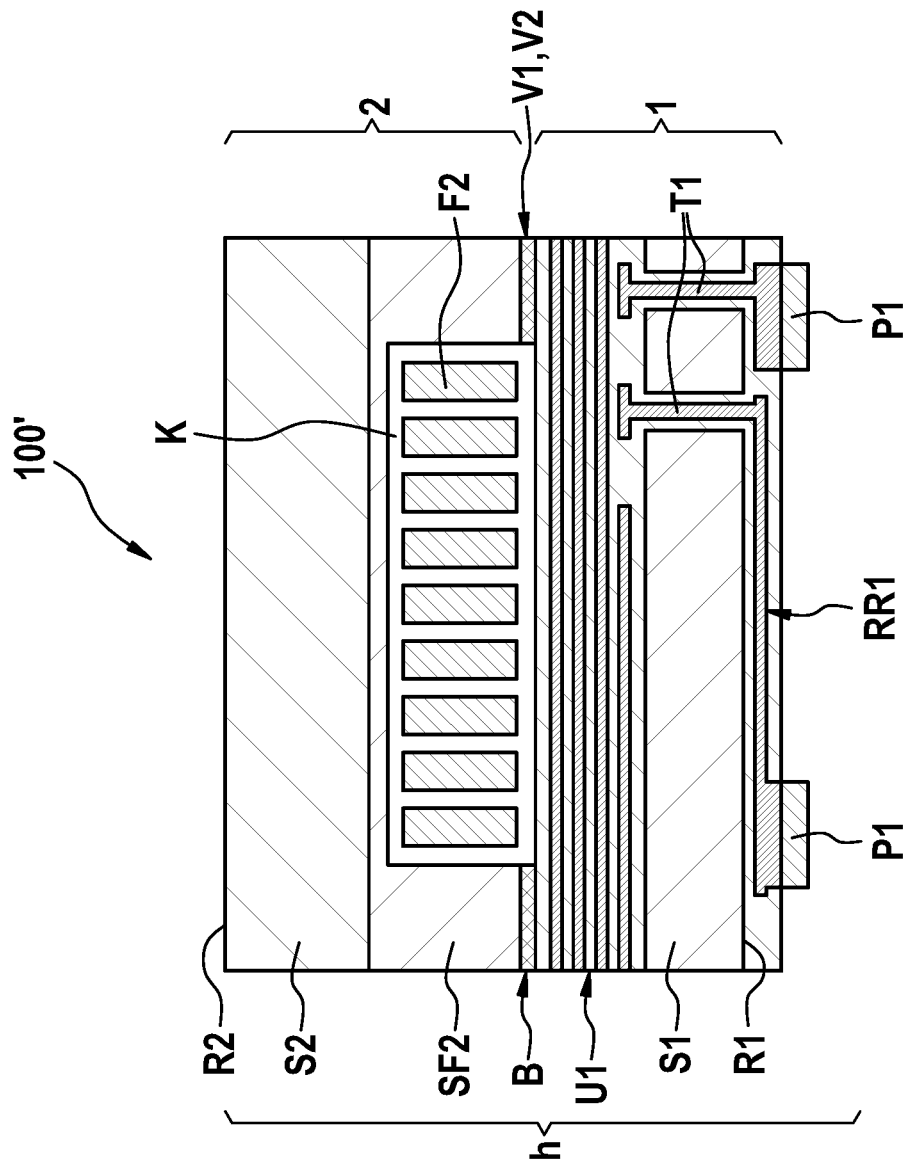

Reference numeral 2 in FIG. 1A2 identifies a MEMS component including a second front side V2 and a second rear side R2, a micromechanical functional element F2 situated in a cavity K being provided at second front side V2. For example, micromechanical functional element F2 is a spring-mounted inertial sensor.

MEMS component S2 includes a MEMS substrate 2 and a functional layer area SF2 applied thereto, functional layer area SF2 including a plurality of micromechanical functional layers, in particular, oxide layers, polysilicon layers and metal layers, etc., in which micromechanical functional element F2 is formed.

A second metallic bonding layer B2, which is made of germanium, for example, is applied to second front side V2 and which, like the first metallic bonding layer as well, is applied circumferentially in a ring-shaped manner having the same dimensions as those of first metallic bonding layer B1, which is to be connected in the aforementioned bonding process to first metallic bonding layer B1.

Although the process steps according to FIGS. 1A1 and 1A2, as well as the process steps represented in the remaining figures are represented based on individual chips, these steps may, of course, also be carried out in the wafer composite using a MEMS wafer and an ASIC wafer (not depicted).

Further with reference to FIG. 1B, first front side V1 is now bonded to second front side V2 for stacking ASIC component 1 and MEMS component 2 using first metallic bonding layer B1 and second metallic bonding layer B2. In this bonding process, cavity K is hermetically sealed with the aid of a circumferential bonding frame B formed by the bonding process.

The metallic bonding method used in this specific embodiment is a eutectic bonding of first metallic bonding layer B1 made of aluminum to second metallic bonding layer B2 made of germanium. In this method, temperatures slightly above the eutectic point, i.e., in the temperature range of 430° C. to 460° C., are normally used. In order to prevent potentially occurring deflections of ASIC component 1 and MEMS component 2, the stack in this first specific embodiment is bonded below the eutectic point, for the material combination aluminum-germanium, preferably in the range of 390° C. to 420° C., particularly preferably between 400° C. and 410° C. At these reduced bonding temperatures, no liquid phase is formed, but the material partners aluminum and germanium are joined via solid diffusion processes. Since these processes run significantly slower than diffusion processes and mixing processes in the liquid phase, the spatial and temporal homogeneity of the bonding process is also significantly improved. As a result, this results in lower stresses in the stack and thus in lower deflection values, which facilitates the further processing and, in particular, later allows for a more pronounced back-thinning of the stack, as described in detail below.

Although not expressly represented in FIG. 1B, electrical contacts (not depicted) may also be manufactured between ASIC component 1 and MEMS component 2.

Figure 1C:
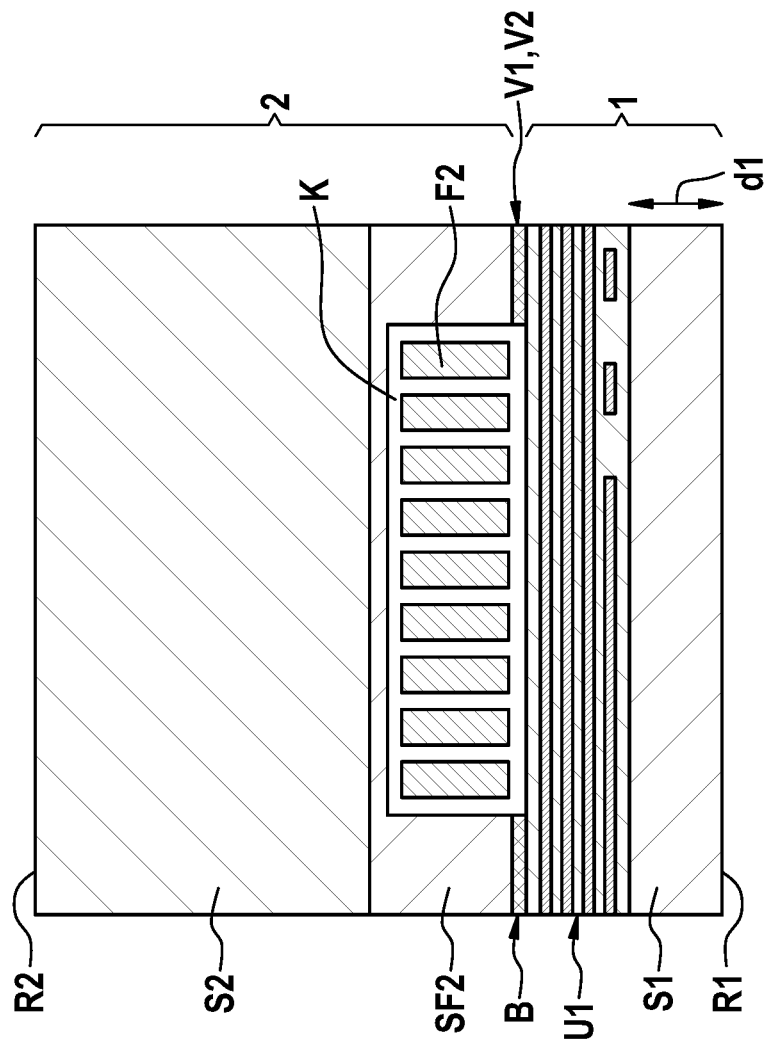

Further with reference to FIG. 1C, ASIC substrate S1 is back-thinned with the aid of a grinding process and CMP process (chemical-mechanical polishing) to a predefined target thickness d1.

Figure 1D:
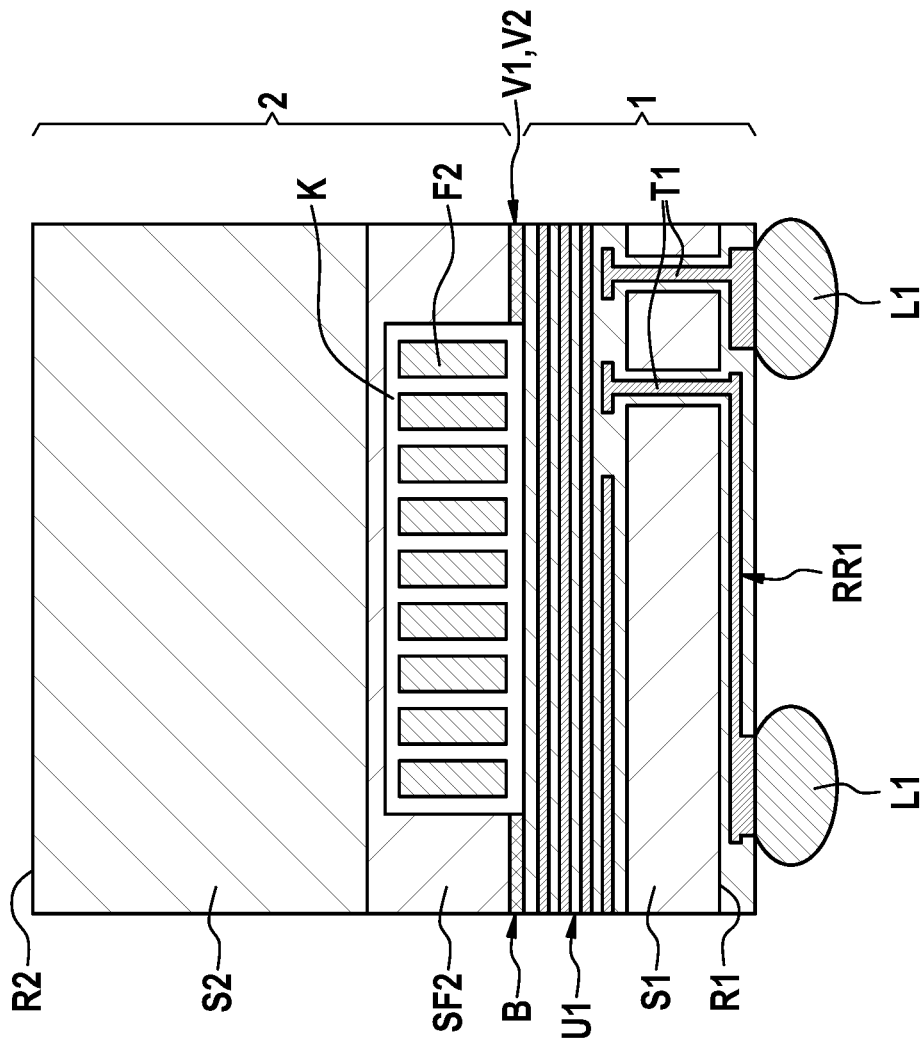

As represented in FIG. 1D, the formation of one or of multiple vias T1 subsequently takes place starting from the back-cut first rear side R1 and from a redistribution unit RR1 on first rear side R1, via T1 contacting strip conductor unit U1 electrically with redistribution unit RR1.

Redistribution unit RR1 includes, in particular, just as strip conductor unit U1, a plurality of conductive and non-conductive layers.

Furthermore, electrical contact elements L1, for example, solder balls, are formed on corresponding areas of redistribution unit RR1, which are designed for the external electrical connection of redistribution unit RR1 and thus of the entire stacked component. Such an electrical connection may be implemented, for example, with the aid of a circuit board (not depicted).

Figure 1E:
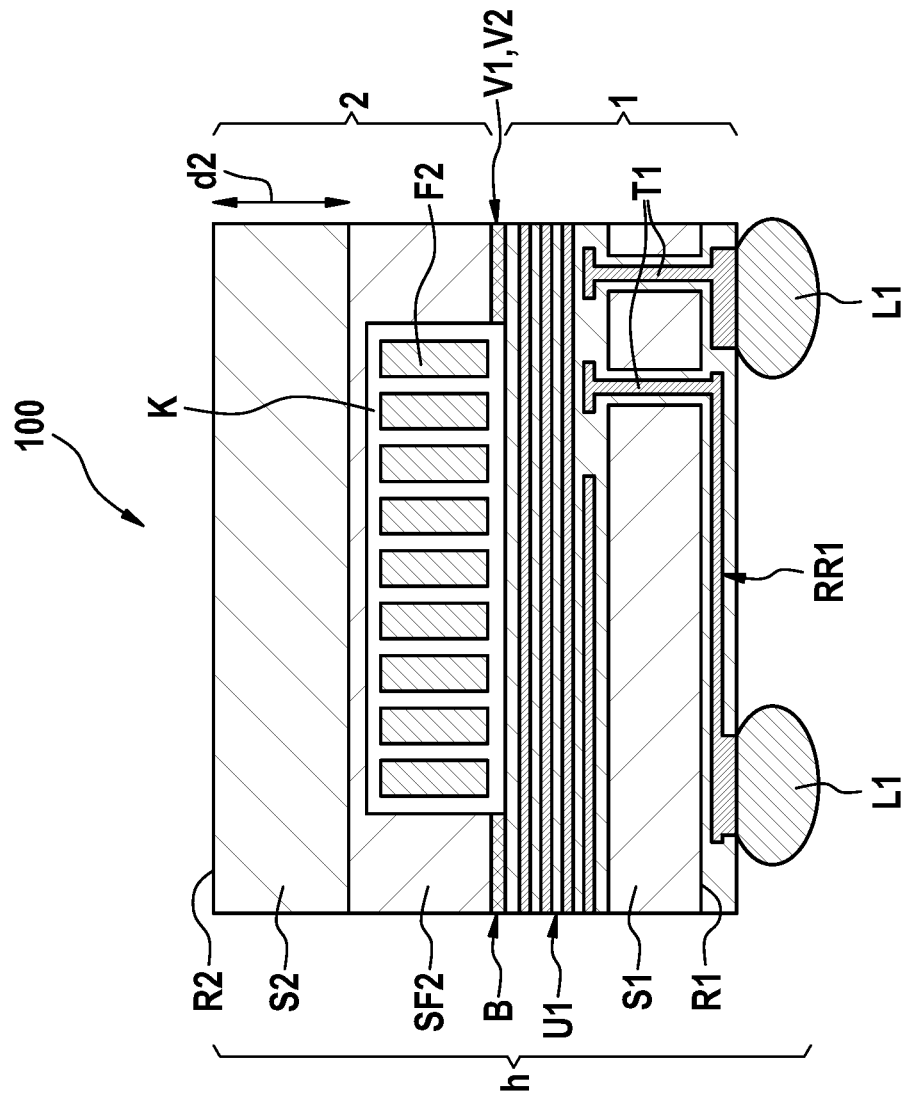

Finally, a back-thinning of second rear side R2 takes place according to FIG. 1E and thus of MEMS substrate S2 to a second predefined target thickness d2. Just like the back-thinning of ASIC substrate 1, this takes place with the aid of a grinding process and CMP process.

In conventional stacked micromechanical components, the thickness of at least one of the two components of the stack after back-thinning is still several hundred micrometers, typically 300 to 600 micrometers.

In the present first specific embodiment, second target thickness d2 of MEMS substrate S2 is set in the processing step according to FIG. 1e) in such a way that it is on the order of 100 micrometers. Since the back-thinning of MEMS component 1 is the last process step, in this case except for the laser marking and (in the wafer composite) separation, for example, by sawing, there is no problem in the preceding critical process steps with respect to wafer handling or wafer deflection.

Thus, the representation in FIG. 1E shows the final state of the stacked micromechanical component 100 including electrical contact elements L1, which may also be reduced in size within certain limits in order, for example, after being soldered on a circuit board (not depicted), to implement a preferably minimal projection (distance between the upper side of the circuit board and the underside of micromechanical component 100). The total height of the component, i.e., the projection plus stack thickness, in particular, is decisive for the application.

The ultra-thin micromechanical component according to the present invention is intended for applications with extreme overall size sensitivity and, in particular, overall height sensitivity. This includes, in particular, the use of such a micromechanical component in a contact lens, for example, in a multi-focal lens, acceleration sensors being able to measure changes of the position or of the viewing direction of the left and right eye and the desired focus point being capable of being deduced from the relative orientation of the two eyes, as is described, for example, in U.S. Patent Application Publication No. U.S. 2015/077658 A1.

Ultra-thin micromechanical components together with a miniaturized battery, a microcontroller and Bluetooth sensor may also be swallowed in tablet form in so-called smart pills or digital pills, in order to monitor medical data, for example, pressure or acceleration in the intestinal tract or general movement patterns and activity patterns of patients. A small overall size is of course an obvious advantage for the system integration in an easily ingestible tablet.

In smart patches (bandages) as well, the use of very thin micromechanical components is advantageous in order to simplify the system integration and to enhance the wear comfort.

In smart clothes (clothing), ultra-thin micromechanical components may be used to monitor physical activities. The thinner these micromechanical components are, the less visible and noticeable they become for the user.

Ultra-thin micromechanical components may further be easily integrated into or onto flexible circuit boards and, as a result, are suitable for numerous new installation positions and fields of application.

To the extent evaluation means, for example, capacitive electrode surfaces or piezo-resistors, in which MEMS component 1 is situated or mounted, the ratio of MEMS wafer thickness d2 to ASIC wafer thickness d1 is preferably in the range of 1:1 to 4:1, particularly preferably in the range of 1.5:1 to 2.5:1. The somewhat larger thickness of MEMS component 2 as compared to ASIC component 1 results in improved performance, since MEMS component 1 is still comparatively rigid despite the smaller overall stack thickness.

Conversely, if the evaluation means is situated or mounted on ASIC component 1, the ratio of MEMS wafer thickness d2 to ASIC wafer thickness d1 is preferably in the range of 1:4 to 1:1, preferably in the range of 1:2.5 to 1:1.5. In such an arrangement of the evaluation means, the somewhat greater thickness of ASIC component 1 as compared to MEMS component 2 results in improved performance.

Electrical contact elements L1 preferably have a height (thickness) of maximal 100 micrometers before soldering or maximal 70 micrometers, particularly preferably maximal 50 micrometers, after soldering. The result is a very low overall size on the application circuit board in connection with the very minimal stack thickness.

FIG. 2 schematically shows a cross sectional representation for explaining a micromechanical component according to one second specific embodiment of the present invention.

Micromechanical component 100' according to FIG. 2 differs from micromechanical component 100, which has been described above, in that solder pads P1 instead of solder balls are formed as electrical contact elements on redistribution unit RR1. This occurs preferably via a galvanic deposition method. With the aid of this galvanic deposition method, it is possible to easily implement particularly small projections onto the circuit board after soldering.

Figure 3A:
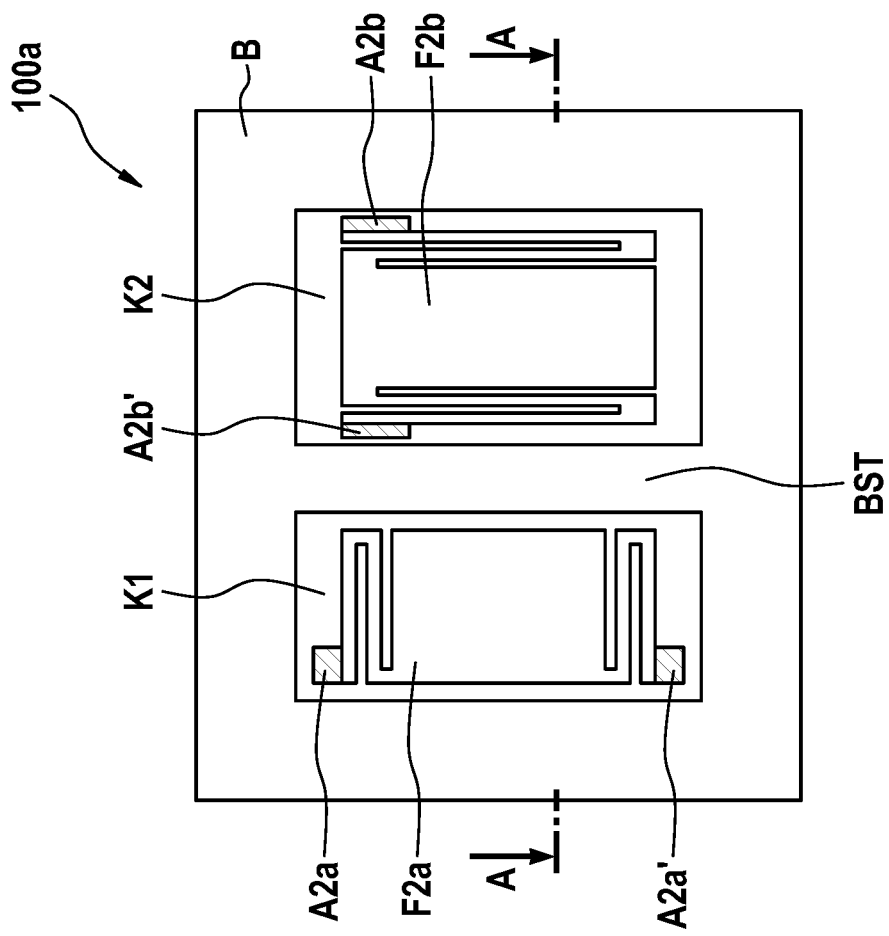
FIGS. 3A and 3B schematically show cross sectional representations for explaining a micromechanical component according to one third specific embodiment of the present invention, FIG. 3A showing a horizontal cross sectional representation through the bonding frame and FIG. 3B showing a vertical cross sectional representation along line A-A' of FIG. 3A.
Figure 3B:
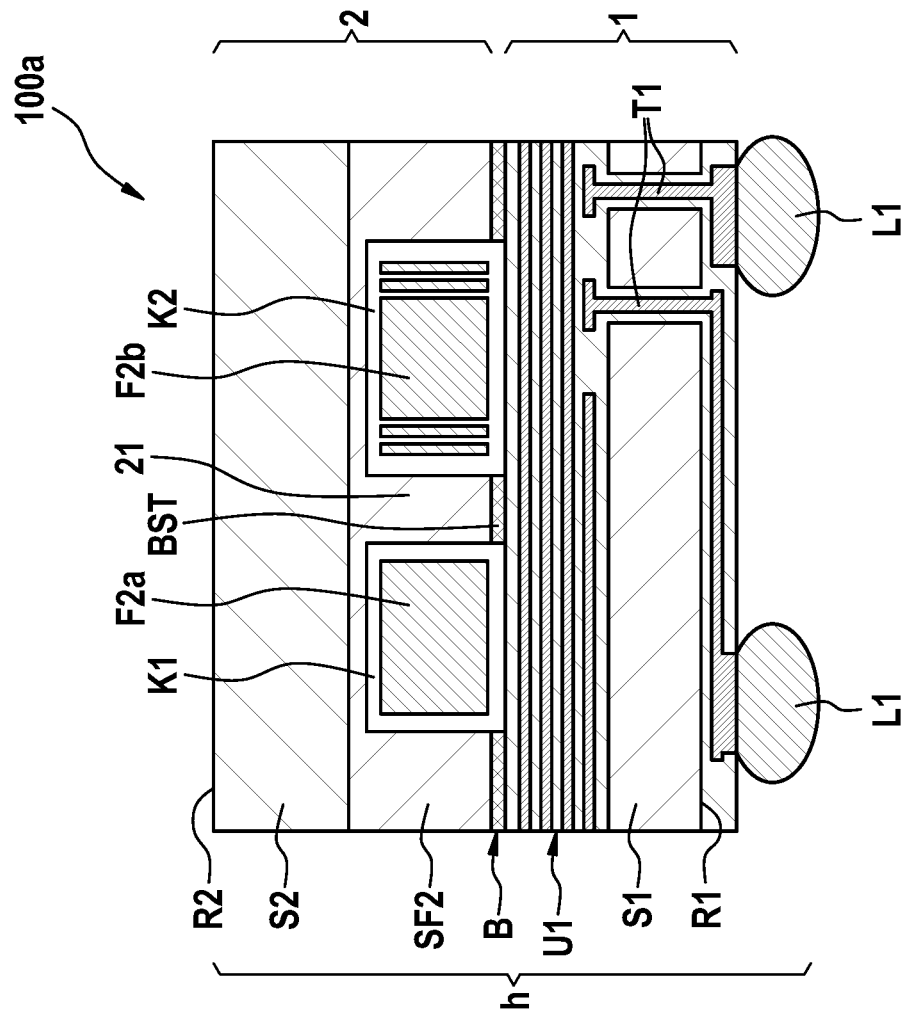

FIGS. 3A, 3B schematically show cross sectional representations for explaining a micromechanical component according to one third specific embodiment of the present invention, FIG. 3A showing a horizontal cross sectional representation through the bonding frame and FIG. 3B showing a vertical cross sectional representation along line A-A' of FIG. 3A.

In micromechanical component 100a according to the third specific embodiment shown in FIGS. 3A, 3B, cavity K of the first specific embodiment is divided into one first sub-cavity K1 and one second sub-cavity K2.

A further bonding area BST, which connects ASIC component 1 and MEMS component 2 to one another, is provided within circumferential bonding frame B. Further bonding area BST is connected to a mechanical support web 21, which hermetically seals off first sub-cavity K1 and second sub-cavity K2 from one another.

One first micromechanical functional element F2a is provided in first sub-cavity K1 and one second micromechanical functional element F2b is provided in second sub-cavity K2. The mountings of first micromechanical component F2a are identified with reference signs A2a and A2a'. The mountings of second micromechanical component F2b are identified with reference signs A2b and A2b'.

First micromechanical component F2a and second micromechanical component F2b form a biaxial acceleration sensor in the form of two independent spring mass systems, first micromechanical component F2a being deflectable in a first direction and second micromechanical component F2b being deflectable in a second direction that extends orthogonally to the first direction.

Mechanical support web 21, which is formed in the present example, from micromechanical functional layer area SF2, is used for additional stabilization, so that the overall stiffness of the stack is increased significantly. In contrast, outer circumferential bonding frame B is used for hermetically sealing off micromechanical component 100a. When mechanical stresses occur, micromechanical functional elements F2a, F2b will thus exhibit smaller signal errors, for example offsets and sensitivity errors in an acceleration sensor, than without the stabilizing web.

Figure 4:
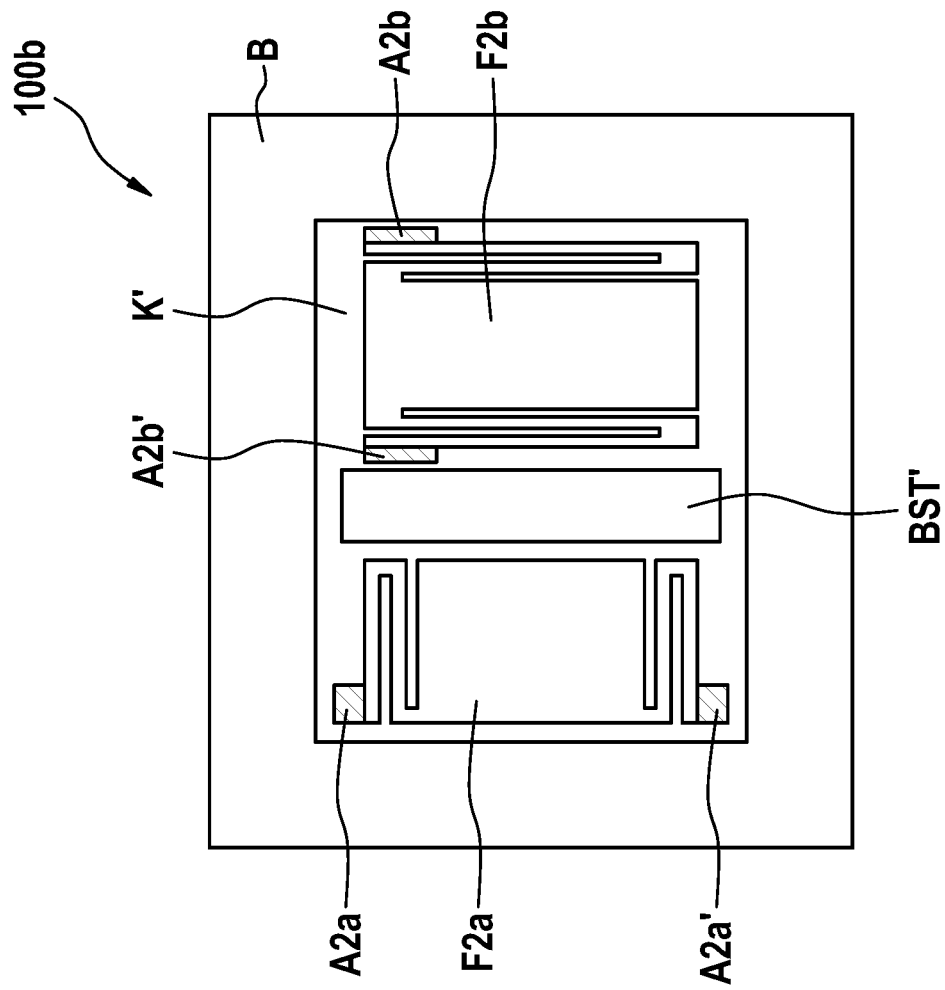
FIG. 4 schematically shows a cross sectional representation for explaining a micromechanical component according to one fourth specific embodiment of the present invention.

FIG. 4 schematically shows a cross sectional representation for explaining a micromechanical component according to one fourth specific embodiment of the present invention.

Micromechanical component 100b according to the fourth specific embodiment, which is represented in FIG. 4, differs from micromechanical component 100a according to the third specific embodiment in that further bonding area BST' and the mechanical support web (not depicted) does not separate cavity K' into two sub-cavities K1, K2, rather cavity K' is a shared cavity for first micromechanical component F2a and second micromechanical component F2b having a homogenous gas pressure. The fourth specific embodiment is otherwise constructed similarly to the third specific embodiment.

Figure 5:
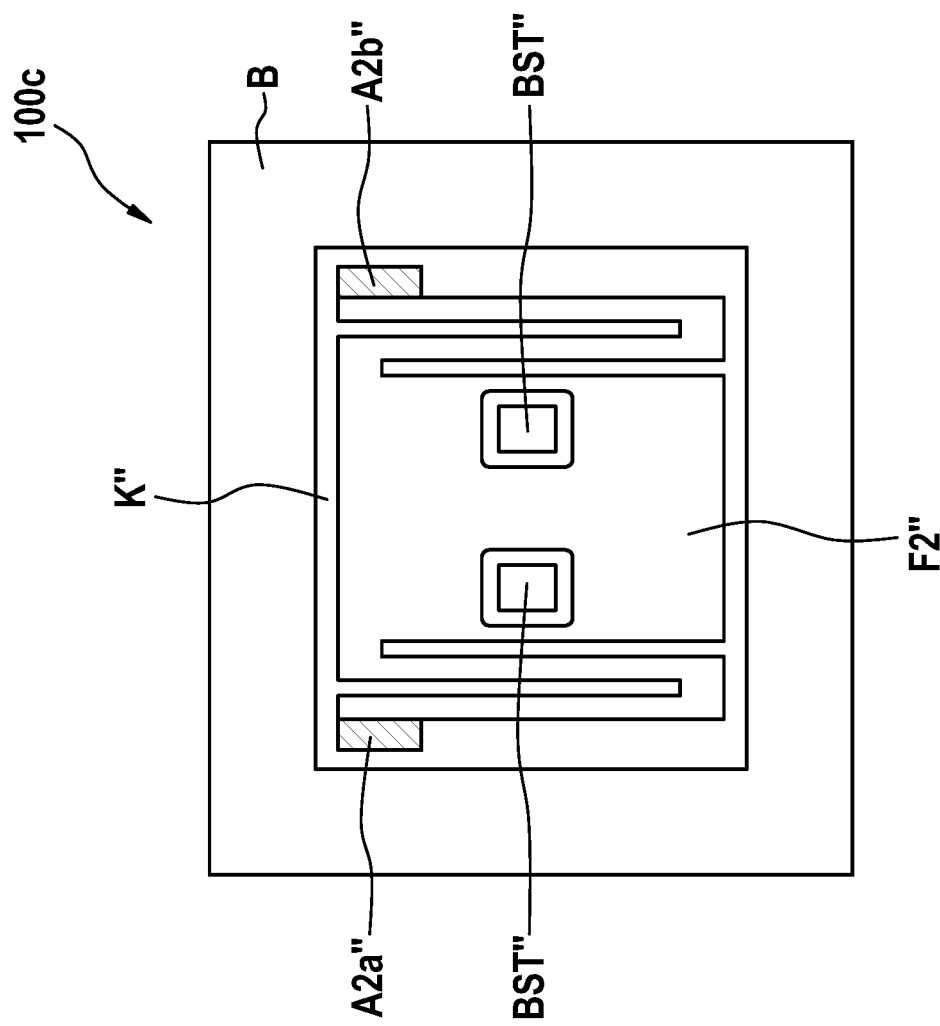
FIG. 5 schematically shows a cross sectional representation for explaining a micromechanical component according to one fifth specific embodiment of the present invention.

FIG. 5 schematically shows a cross sectional representation for explaining a micromechanical component according to one fifth specific embodiment of the present invention.

Micromechanical component 100c according to the fifth specific embodiment includes a single micromechanical functional element F2", which is mounted at two mountings A2a", A2b". There are mechanical support pillars (not depicted) in cavity K", which form a connection via further bonding areas BST" between MEMS component 2 and ASIC component 1, and which are guided through micromechanical functional element F".

The stability of the stack may also be increased by such a configuration of columnar support pillars.

Figure 6:
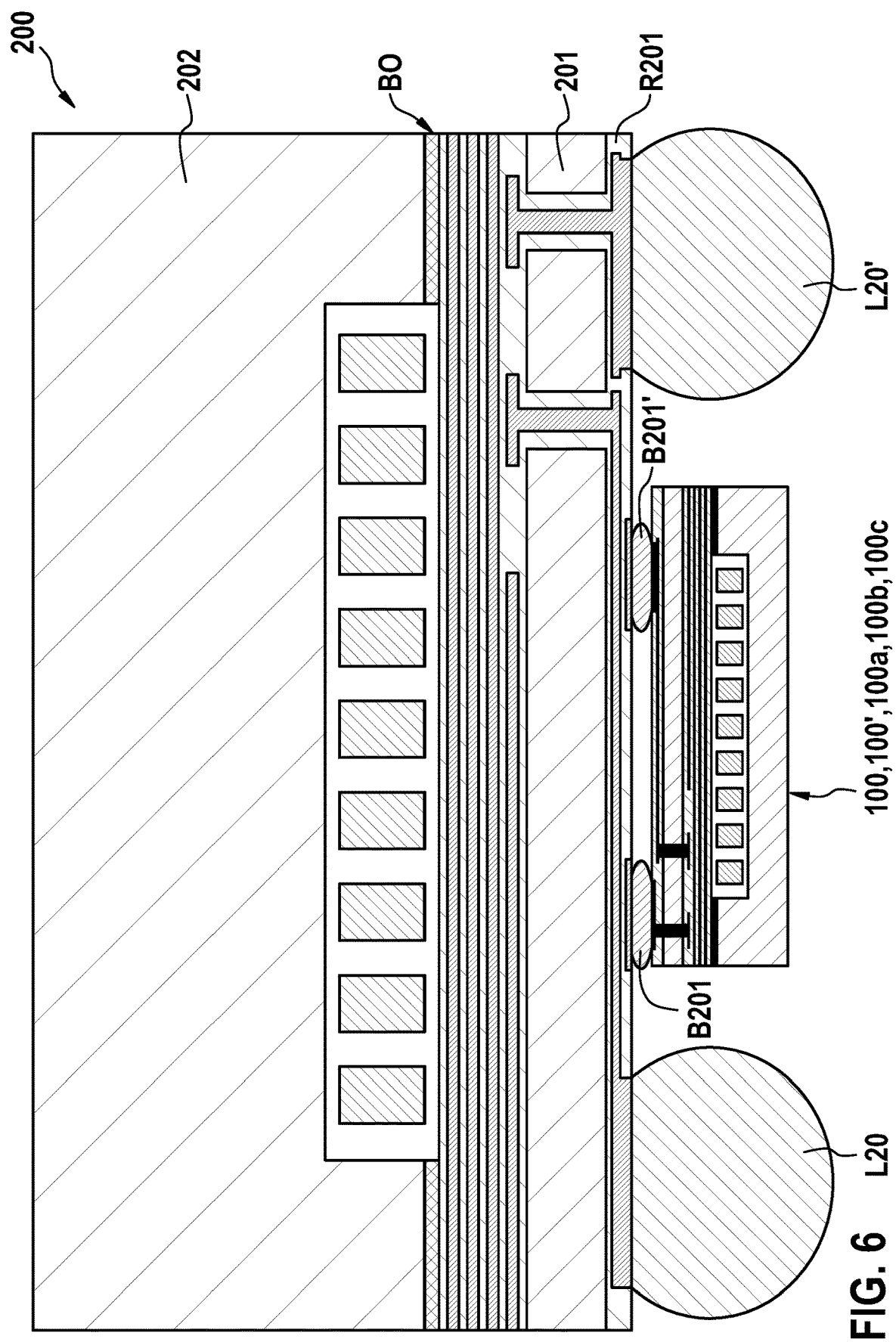
FIG. 6 schematically shows a cross sectional representation for explaining a configuration of micromechanical components according to one sixth specific embodiment of the present invention.

FIG. 6 schematically shows a cross sectional representation for explaining a configuration of micromechanical components according to one sixth specific embodiment of the present invention.

The configuration of micromechanical components according to FIG. 6 includes a first micromechanical component 100, 100', 100a, 100b, 110c, as it has been described in the preceding specific embodiments.

The configuration further includes a stacked second micromechanical component 200, which has significantly larger dimensions than first micromechanical component 100, 100', 100a, 100b, 100c. Second micromechanical component 200 is constructed similarly to first micromechanical component 100, 100', 100a, 100b, 100c, for example, as a stack of an ASIC component 201 and a MEMS component 202, which are connected by a bonding frame BO.

In this configuration, first micromechanical component 100, 100', 100a, 100b, 100c is attached via solder connections B201, B201' on a redistribution unit R201 between electrical contacts L20, L20' of second micromechanical component 200, electrical contact elements L20, L20' being designed for the external connection of redistribution unit R201 and thus of second micromechanical component 200.

Since electrical contact elements L20, L20' have a greater height than first micromechanical component 100, 100', 100a, 100b, 100c, it is possible to attach such a configuration on a circuit board with the aid of electrical contact elements L20, L20' without first micromechanical component 100, 100', 100a, 100b, 100c resting on the circuit board. Typical projections of such electrical contact elements L20, L20', for example, in the form of solder balls, are on the order of 100 to 200 micrometers after soldering.

Such a configuration could also be figuratively referred to as a kangaroo configuration of micromechanical components.

FIG. 7 schematically shows a cross sectional representation of a configuration of micromechanical components according to one seventh specific embodiment of the present invention.

In the seventh specific embodiment according to FIG. 7, second micromechanical component 200a is, similar to the sixth specific embodiment, significantly larger than first micromechanical component 100, 100', 100a, 100b, 100c.

In this specific embodiment, second micromechanical component 200a is designed as an ASIC component including ASIC substrate 201a and a strip conductor unit R201a attached on the front side. For example, it could be a microcontroller, a processor, a monolithically integrated sensor or the like. As in the sixth specific embodiment, a kangaroo configuration is implemented here as well, first micromechanical component 100, 100', 100a, 100b, 100c being situated on the front side of second micromechanical component 200a via solder connections B201a, B201a'.

The stack thus formed may be attached on a circuit board (not depicted) in Flip-Chip technology via contact elements L20a, L20a' of second micromechanical component 200a, which are provided on strip conductor unit R201a.

FIG. 8 schematically shows a cross sectional representation for explaining a configuration of micromechanical components according to one eighth specific embodiment of the present invention.

In the eighth specific embodiment a kangaroo configuration is also implemented, second micromechanical component 200b including multiple semiconductor chips C1, C1, which are situated via an adhesive bond KL on a carrier substrate SM with a redistribution unit UV. Bonding connections BO implement a connection between bonding pads BP of semiconductor chips C1, C1 among one another and with carrier substrate SM. Semiconductor chips C1, C1 and the circuit components are packaged in a mold compound M.

First micromechanical component 100, 100', 100a, 100b, 100c is mounted in a kangaroo configuration at the underside via electrical contacts B100, B100' between electrical contact elements L20b, L20b' of second micromechanical component.

In this specific embodiment, there is, in contrast between the sixth and seventh specific embodiment no direct mechanical connection between first mechanical component 100, 100', 100a, 100b, 100c and chips C1, C2 of the BGA mold package.

Although the present invention has been fully described above with reference to preferred exemplary embodiments, it is not limited thereto, but is modifiable in a variety of ways.

The specified materials and structures are, in particular, only exemplary and not restrictively specified.

Although the described micromechanical component is preferably an acceleration sensor, a rotation rate sensor, a pressure sensor or a combination of at least two of these sensor types, preferably including a capacitive evaluation principle, the present invention is not limited thereto but is applicable, in principle, for arbitrary MEMS components.

What is claimed is:

1. A manufacturing method for a micromechanical component, comprising the following steps:
   providing an ASIC component including a first front side and a first rear side, a strip conductor unit being provided at the first front side;
   providing a MEMS component including a second front side and a second rear side, a micromechanical functional element situated in a cavity being provided at the second front side;

bonding the first front side onto the second front side for stacking the ASIC component and the MEMS component, the cavity being sealed with the aid of a circumferential bonding frame;

back-thinning the first rear side to reduce a thickness of the ASIC component;

forming one or multiple vias starting from the back-thinned first rear side and from a redistribution unit on the first rear side, the vias electrically connecting the strip conductor unit to the redistribution unit;

forming electrical contact elements on the redistribution unit, which are configured for an external electrical connection of the redistribution unit; and back-thinning the second rear side to reduce a thickness of the ASIC component, the back-thinning of the first and second rear side taking place in such a way that a thickness of a stack made up of the ASIC component and the MEMS component is less than 300 micrometers.

2. The manufacturing method as recited in claim 1, wherein the bonding takes place via a metallic bonding process, prior to the bonding, a first bonding layer is applied to the first front side and a second bonding layer is applied to the second front side, which are connected to one another during bonding in a thermal process.

3. The manufacturing method as recited in claim 2, wherein one of the first and second bonding layers is made of aluminum and the other of the first and second bonding layers is made of germanium, and the thermal process is a thermally activated diffusion process at a temperature below 420° C.

4. The manufacturing method as recited in claim 1, wherein at least one further bonding area, which connects the ASIC component and the MEMS component to one another, is provided within the circumferential bonding frame.

5. The manufacturing method as recited in claim 4, wherein the further bonding area is connected to a mechanical support web or to a mechanical support pillar of the MEMS component, which is decoupled from the micromechanical functional element.

6. The manufacturing method as recited in claim 5, wherein the further bonding area is connected to the mechanical support web, which separates the cavity into one first sub-cavity and into one second sub-cavity, which are hermetically sealed off from one another, a first micromechanical functional element being provided in the first sub-cavity and a second micromechanical functional element being provided in the second sub-cavity.

7. The manufacturing method as recited in claim 5, wherein the further bonding area is connected to a mechanical support pillar, which is guided through the micromechanical functional element.

8. The manufacturing method as recited in claim 1, wherein the electrical contact elements are solder balls and/or solder pads.

9. The manufacturing method as recited in claim 1, wherein the micromechanical functional element is formed from a plurality of vertically stacked micromechanical functional layers.

10. A micromechanical component, comprising:
an ASIC component including a first front side and a first rear side, a strip conductor unit being provided at the first front side;
a MEMS component including a second front side and a second rear side, a micromechanical functional element situated in a cavity being provided at the second front side, the first front side being bonded onto the second front side for stacking the ASIC component and the MEMS component with the aid of a circumferential bonding frame, the cavity being sealed by the circumferential bonding frame;
one or multiple vias starting from the first rear side and a redistribution unit on the first rear side, the vias electrically connecting the strip conductor unit to the redistribution unit; and
electrical contact elements on the redistribution unit, which are configured for an external electrical connection of the redistribution unit;
wherein a thickness of a stack made up of the ASIC component and the MEMS component is less than 300 micrometers.

11. The micromechanical component as recited in claim 10, wherein at least one further bonding area, which connects the ASIC component and the MEMS component to one another, is provided within the circumferential bonding frame.

12. The micromechanical component as recited in claim 10, wherein the further bonding area is connected to a mechanical support web or to a mechanical support pillar of the MEMS component, which is decoupled from the micromechanical functional element.

13. The micromechanical component as recited in claim 11, wherein the further bonding area is connected to a mechanical support web, which divides the cavity into one first sub-cavity and into one second sub-cavity, which are hermetically sealed off from one another, a first micromechanical functional element being provided in the first sub-cavity and a second micromechanical functional element being provided in the second sub-cavity.

14. The micromechanical component as recited in claim 11, wherein the further bonding area is connected to a support pillar, which is guided through the mechanical functional element.

15. A configuration of micromechanical components, comprising:
a first micromechanical component including:
an ASIC component including a first front side and a first rear side, a strip conductor unit being provided at the first front side,
a MEMS component including a second front side and a second rear side, a micromechanical functional element situated in a cavity being provided at the second front side, the first front side being bonded onto the second front side for stacking the ASIC component and the MEMS component with the aid of a circumferential bonding frame, the cavity being sealed by the circumferential bonding frame,
one or multiple vias starting from the first rear side and a redistribution unit on the first rear side, the vias electrically connecting the strip conductor unit to the redistribution unit, and
electrical contact elements on the redistribution unit, which are configured for an external electrical connection of the redistribution unit,
wherein a thickness of a stack made up of the ASIC component and the MEMS component is less than 300 micrometers; and
a second micromechanical component, the first micromechanical component being mounted on a redistribution unit between electrical contact elements of the second micromechanical component, which are configured for an external electrical connection of the redistribution unit, and the electrical contact elements having a greater height than the first micromechanical component.

* * * * *